US008765595B2

(12) United States Patent
Cooney, III et al.

(10) Patent No.: US 8,765,595 B2
(45) Date of Patent: Jul. 1, 2014

(54) THICK ON-CHIP HIGH-PERFORMANCE WIRING STRUCTURES

(75) Inventors: Edward C. Cooney, III, Jericho, VT (US); Jeffrey P. Gambino, Westford, VT (US); Zhong-Xiang He, Essex Junction, VT (US); Tom C. Lee, Essex Junction, VT (US); Xiao H. Liu, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/345,120

(22) Filed: Jan. 6, 2012

(65) Prior Publication Data

US 2013/0175073 A1    Jul. 11, 2013

(51) Int. Cl.
    *H01L 21/4763* (2006.01)
(52) U.S. Cl.
    USPC ................. 438/622; 438/672; 257/E21.585
(58) Field of Classification Search
    None
    See application file for complete search history.

(56) References Cited

U.S. PATENT DOCUMENTS

| 6,184,121 | B1 | 2/2001 | Buchwalter et al. |
| 6,218,733 | B1 * | 4/2001 | Fiordalice et al. ............ 257/751 |
| 6,667,217 | B1 | 12/2003 | Hsu et al. |
| 2005/0074905 | A1 | 4/2005 | Lee |
| 2008/0100408 | A1 | 5/2008 | Chen |
| 2008/0253164 | A1 | 10/2008 | Blanchard |
| 2009/0189725 | A1 | 7/2009 | Ding et al. |
| 2009/0239377 | A1 * | 9/2009 | Motoyama ................. 438/643 |
| 2011/0000705 | A1 * | 1/2011 | Moriwaki .................. 174/258 |
| 2012/0142177 | A1 * | 6/2012 | Kim et al. ................. 438/585 |

FOREIGN PATENT DOCUMENTS

WO    2004032191 A2    4/2004

OTHER PUBLICATIONS

U.S. ISA, International Search Report and Written Opinion issued in international application No. PCT/US13/20092 dated Mar. 14, 2013.

* cited by examiner

*Primary Examiner* — Cheung Lee
(74) *Attorney, Agent, or Firm* — Wood, Herron & Evans LLP; Anthony J. Canale

(57) ABSTRACT

Methods for fabricating a back-end-of-line (BEOL) wiring structure, BEOL wiring structures, and design structures for a BEOL wiring structure. The BEOL wiring may be fabricated by forming a first wire in a dielectric layer and annealing the first wire in an oxygen-free atmosphere. After the first wire is annealed, a second wire is formed in vertical alignment with the first wire. A final passivation layer, which is comprised of an organic material such as polyimide, is formed that covers an entirety of a sidewall of the second wire.

16 Claims, 5 Drawing Sheets

US 8,765,595 B2

THICK ON-CHIP HIGH-PERFORMANCE WIRING STRUCTURES

BACKGROUND

The invention relates generally to integrated circuit fabrication and, in particular, to methods for fabricating wiring structures during back-end-of-line (BEOL) processing of semiconductor chips, BEOL wiring structures, and design structures for a BEOL wiring structure.

A BEOL wiring structure is used to route signals to and from the active devices of an integrated circuit and to provide power to and among the various circuit functions on a chip. The BEOL wiring structure may include wiring embedded in a stack of dielectric layers to create a stack of metallization levels defining an interconnection network for the signals and power. The BEOL wiring structure may be fabricated using damascene processes in which the metallization levels are individually formed.

On-chip inductors are passive devices commonly utilized in monolithic integrated circuits designed to operate at high frequencies, such as those found in wireless communication devices. In particular, on-chip inductors may be utilized in radiofrequency integrated circuits (RFICs), which are found in applications such as Phase-Locked Loop (PLL) transmitters, voltage controlled oscillators (VCOs), impedance matching networks, filters, etc.

On-chip inductors may be integrated into one or more of the metallization levels of the BEOL wiring structure. On-chip inductors may be formed with standard semiconductor processing steps used to form BEOL wiring structures and without the necessity of introducing additional processing steps or additional masks. In particular, an on-chip inductor may be comprised of wires disposed within one or more metallization levels of the BEOL wiring structure.

Improved methods for fabricating a BEOL wiring structure, as well as improved BEOL wiring structures and improved design structures for a BEOL wiring structure, are needed.

SUMMARY

In an embodiment of the invention, a method is provided for fabricating a back-end-of-line wiring structure. The method includes forming a first wire in a dielectric layer and annealing the first wire in an oxygen-free atmosphere. After the first wire is annealed, a second wire is formed in vertical alignment with the first wire. The method further includes forming a final passivation layer comprised of an organic material that covers an entirety of a sidewall of the second wire.

According to another embodiment of the present invention, a back-end-of-line (BEOL) wiring structure includes a dielectric layer, a first wire in the dielectric layer, a second wire in vertical alignment with the first wire, and a final passivation layer comprised of an organic material. The final passivation layer covers an entirety of a sidewall of the second wire.

In an embodiment of the invention, a hardware description language (HDL) design structure is encoded on a machine-readable data storage medium. The HDL design structure comprises elements that, when processed in a computer-aided design system, generates a machine-executable representation of a back-end-of-line (BEOL) wiring structure. The HDL design structure includes a dielectric layer, a first wire in the dielectric layer, a second wire in vertical alignment with the first wire, and a final passivation layer comprised of an organic material. The final passivation layer covers an entirety of a sidewall of the second wire. The HDL design structure may comprise a netlist. The HDL design structure may also reside on storage medium as a data format used for the exchange of layout data of integrated circuits. The HDL design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
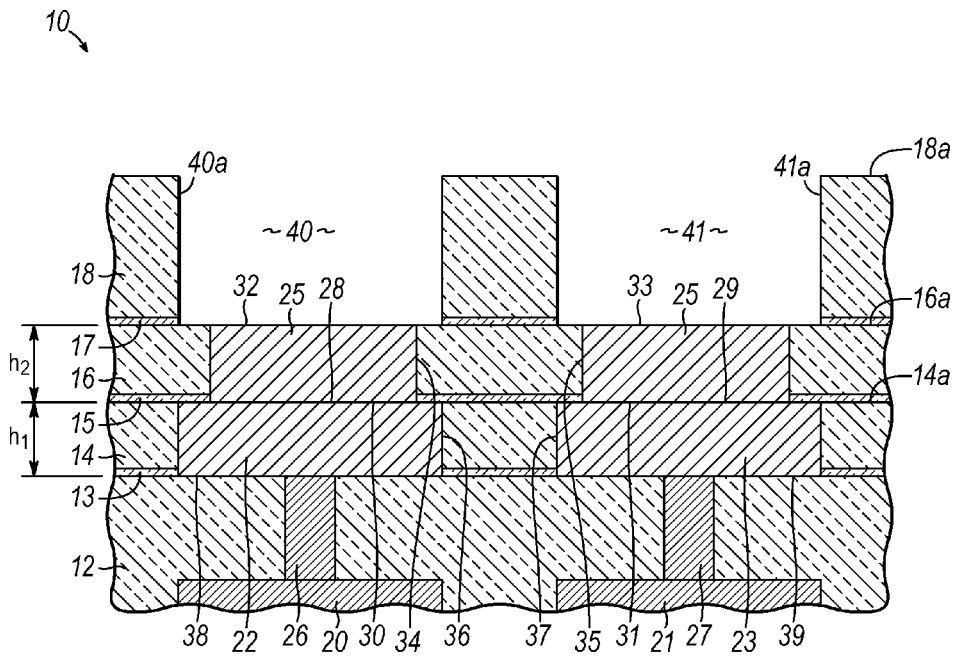
FIGS. 1-5 are cross-sectional views of a portion of a BEOL interconnection structure at successive stages of a processing method in accordance with an embodiment of the invention.

With reference to FIG. 1 and in accordance with an embodiment of the invention, a back-end-of-line (BEOL) interconnect structure 10 includes a plurality of dielectric layers 12, 13, 14, 15, 16, 17, 18 that are vertically arranged in a layer stack. Lines or wires 20, 21 are embedded as conductive features in trenches or troughs primarily defined in dielectric layer 12. Lines or wires 22, 23 are embedded as conductive features in trenches or troughs primarily defined in dielectric layer 14. The wires 22, 23 are respectively coupled by via plugs 26, 27 in dielectric layer 12 with the wires 20, 21. Lines or wires 24, 25 are embedded as metallization in trenches or troughs defined primarily in dielectric layer 16 and are respectively coupled with wires 22, 23. Wire 24 laterally overlaps the wire 22 and is in vertical alignment with wire 22. Wire 25 laterally overlaps the wire 23 and is in vertical alignment with wire 23.

In the representative embodiment, wires 22, 23 have respective top surfaces 28, 29 that directly contact respective bottom surfaces 30, 31 of wires 24, 25 and respective bottom surfaces 38, 39 that are directly contacted by the respective via plugs 26, 27. The surfaces 28-31 are nominally coplanar with a top surface 14a of the dielectric layer 14. Wires 24, 25 have respective top surfaces 32, 33 that are nominally coplanar with a top surface 16a of dielectric layer 16. Wires 24, 25 also have respective sidewalls 34, 35 that extend vertically from the bottom surfaces 30, 31 to the respective top surfaces 32, 33 and that terminate at the top surface 16a of dielectric layer 16. Similarly, wires 22, 23 have sidewalls 36, 37 that extend vertically from the bottom surfaces 38, 39 to the top surfaces 28, 29 and that terminate at the top surface 14a of dielectric layer 14.

The thickness or height, $h_1$, of the wires 22, 23, which is measured from the top surfaces 28, 29 to the bottom surfaces 38, 39, is commensurate with the thickness of the dielectric layer 14 and the height of the sidewalls 36, 37. The thickness or height, $h_2$, of the wires 24, 25, which is measured from the top surfaces 32, 33 to the bottom surfaces 30, 31, is commensurate with the thickness of the dielectric layer 16 and the height of the sidewalls 34, 35. Each of the heights $h_1$, $h_2$ may be greater than or equal to 3 microns (μm), and may range from 3 μm to 5 μm.

The BEOL interconnect structure 10 may include two (2) to ten (10) metallization levels each comprised of wiring embedded in one or more dielectric layer. The wiring of the different metallization levels may exhibit hierarchical scaling factors for pitch and cross-sectional dimensions of the constituent wiring. A local interconnect level (not shown) may be used to locally couple the active devices of the integrated circuit.

Each of the dielectric layers 12-18 of the BEOL interconnect structure 10 may comprise any suitable organic or inorganic dielectric material recognized by a person having ordinary skill in the art as an electrical insulator. Candidate inorganic dielectric materials may include, but are not limited to, silicon dioxide ($SiO_2$), silicon nitride, fluorine-doped silicon glass (FSG), and combinations of these dielectric materials. Alternatively, one or more of the dielectric layers 12-18 may be comprised of a dielectric material having a relative permittivity or dielectric constant smaller than the dielectric constant of silicon dioxide (i.e., 3.9). Candidate low-k dielectric materials include, but are not limited to, porous and nonporous spun-on organic low-k dielectrics, such as organosilicate glasses, hydrogen-enriched silicon oxycarbide (SiCOH), or silicon carbide (SiC), and carbon-doped oxides, and combinations of these and other organic and inorganic dielectrics. Such low-k dielectric materials may operate to lower the undesired capacitive coupling in the completed BEOL interconnect structure 10 during chip operation. The dielectric layers 12-18 may be deposited by thermal chemical vapor deposition (CVD), plasma enhanced chemical vapor deposition (PECVD), high density plasma chemical vapor deposition (HPDCVD), or spin coat and cure.

Candidate conductive materials for the wires 20-25 and plugs 26, 27 of the BEOL interconnect structure 10 include, but are not limited to, copper (Cu), aluminum (Al), alloys of these metals, other similar metals like tungsten (W), and metal silicides. These types of metals may be deposited by, for example, electrochemical plating or physical vapor deposition (PVD). In one embodiment, the wires 22-25 are comprised of copper. A thin conductive liner layer (not shown) may respectively clad one or more surfaces of the wires 20-25 and plugs 26, 27 to mitigate diffusion of the constituent conductor into the surrounding dielectric material and to optionally enhance conductor adhesion. As representative examples, the thin conductive liner layer may comprise titanium (Ti), titanium nitride (TiN), tantalum (Ta), tantalum nitride (TaN), or a bilayer of these or other conductors. A seed layer may be applied to the liner layer for initiating electrochemical deposition of the wires 20-25.

Dielectric layers 13, 15, 17 may differ in composition from dielectric layers 12, 14, 16, 18 and be thinner than dielectric layers 12, 14, 16, 18. Because of the differing composition, the dielectric layers 13, 15, 17 may constitute polish stop and/or etch stop layers. In one embodiment, dielectric layers 12, 14, 16, 18 may be thin films comprised of $SiO_2$ or FSG, the dielectric layers 13, 15, 17 may be thin films comprised of $Si_3N_4$ or SiC, and the wires 22-25 may be thin films comprised of Cu.

The wires 22, 23 and dielectric layers 13, 14 define a metallization level of the BEOL interconnect structure 10 and the wires 24, 25 and dielectric layers 15, 16 define another metallization level of the BEOL interconnect structure 10. Each of these metallization levels may be individually formed by lithography, etching, deposition, and polishing techniques characteristic of damascene processes. The BEOL interconnect structure 10 is formed on a die or chip (not shown) that has been processed by front-end-of-line (FEOL) processes to fabricate one or more integrated circuits that contain device structures. The chip may be fabricated using any suitable substrate or wafer of semiconductor material suitable for integrated circuit fabrication.

Trenches, of which trenches 40, 41 are representative, are formed in the dielectric layer 18 by patterning the constituent dielectric material of dielectric layers 17, 18 using conventional lithography and etch operations characteristic of a damascene process. Trenches 40, 41 are defined primarily in dielectric layer 18. The trenches 40, 41 may be continuous and interconnected to define recessed features subsequently filled with conductor to form a passive device such as an on-chip inductor. Alternatively, the trenches 40, 41 may be discontinuous so that conductor subsequently filling trench 40 is electrically isolated from conductor subsequently filling trench 41.

The lithography process may comprise applying a resist layer to a top surface 18a of dielectric layer 18, exposing the resist layer to radiation projected through a photomask, and developing the exposed resist to provide a patterned resist layer. The patterned resist layer includes openings at the intended locations for the trenches 40, 41. The etching process may comprise a reactive ion etch (RIE) or a wet chemical etch, and utilizes the patterned resist layer as an etch mask. The etching process forming the trenches 40, 41 may stop on the dielectric layer 17. The etching process may be continued with a different etch chemistry to extend the trenches 40, 41 through dielectric layer 17 to the depth of the wires 24, 25. The resist layer may be subsequently stripped by ashing or solvent stripping.

The trenches 40, 41 respectively open onto top surfaces 32, 33 of wires 24, 25. Sidewalls 40a, 41a, which may be substantially vertical, are defined in dielectric layer 18 and respectively bound trenches 40, 41. The sidewalls 40a, 41a may be respectively in nominal alignment with the sidewalls 34, 35 of wires 24, 25. The trenches 40, 41 are laterally spaced with a tight pitch of less than or equal to 15 μm so that the resultant wires 44, 45 formed in the trenches 40, 41 are likewise spaced with a commensurate tight pitch. The depth of the etched trenches 40, 41 may be greater than or equal to 5 μm. The lithography process patterning the resist layer is controlled so that trenches 40, 41 nominally replicate the geometrical shape of the underlying wires 24, 25 from a perspective normal to the top surface 16a.

Figure 2:
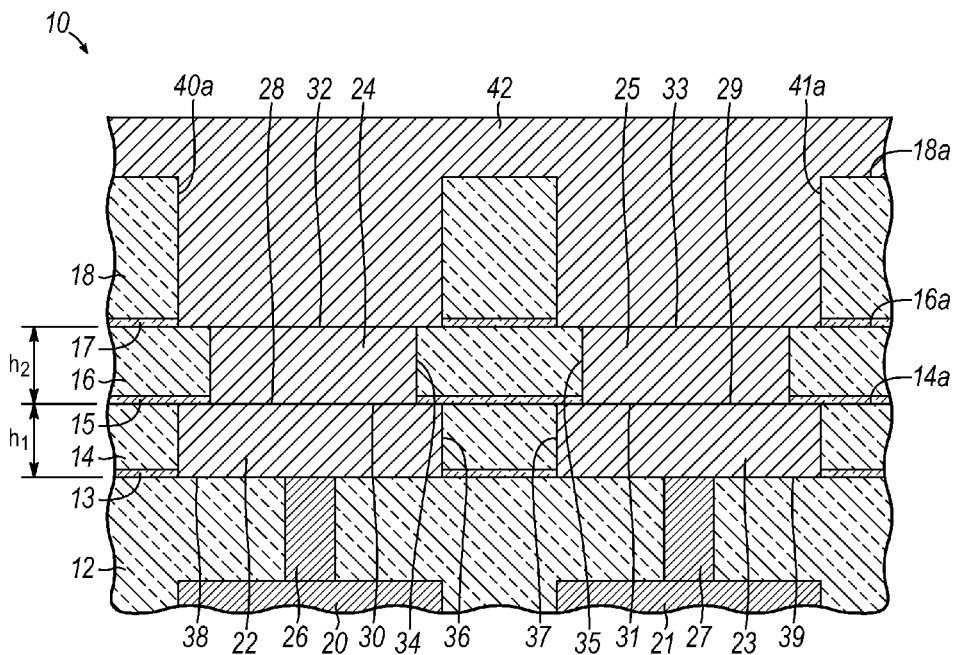

With reference to FIG. 2 in which like reference numerals refer to like features in FIG. 1 and at a subsequent fabrication stage, a conductor layer 42 comprised of a conductor is deposited. The thickness of the conductor layer 42 exceeds the thickness of the dielectric layer 18 so that the trenches 40, 41 are completely filled with conductor. The conductor layer 42 may be comprised of copper (Cu), although other suitable low-resistivity metals and metal alloys may be alternatively chosen. In one embodiment, the conductor layer 42 is comprised of copper. Within each of the trenches 40, 41, a portion of the conductor layer 42 contacts the top surfaces 32, 33 of the wires 24, 25.

The conductor layer 42 may be deposited by a conventional deposition process, such as electrochemical plating or PVD. The sidewalls 40a, 41a of the trenches 40, 41 may be covered with a thin conductive liner layer to clad the wires 44, 45 (FIG. 3) for inhibiting diffusion of the conductor into the surrounding dielectric material. The thin conductive liner layer may comprise Ti, TiN, Ta, TaN, or a bilayer of these or other conductors. To promote electrochemical plating of the conductor layer 42, a seed layer may be applied on the walls of the trenches 40, 41 by, for example, PVD.

An elevated temperature anneal is performed as a thermal treatment that is effective to modify the properties of the conductor layer 42. During the elevated temperature anneal, the conductor layer 42 may be heated to reach a temperature ranging from 250° C. to 425° C. that is sustained for an anneal time ranging from thirty (30) minutes to 270 minutes. In one embodiment, the temperature of the conductor layer 42 during the elevated temperature anneal may range from 375° C. to 400° C. and the anneal time may be sustained for 90 minutes.

The elevated temperature anneal of the conductor layer 42 may be performed in an inert atmosphere within an annealing furnace. The inert atmosphere may be an oxygen-free environment, which prevents oxidation and oxygen diffusion into the conductor layer 42. In one embodiment, the inert atmosphere during the elevated temperature anneal may comprise nitrogen ($N_2$) gas. Preferably, the inert atmosphere is also free of reducing gases, such as hydrogen.

The grains of polycrystalline conductor in the conductor layer 42 are recrystallized by the elevated temperature anneal in the oxygen-free environment. In response to the recrystallization from the elevated temperature anneal, the grain size of the conductor comprising the conductor layer 42 is larger than the grain size in its as-deposited state.

Figure 3:
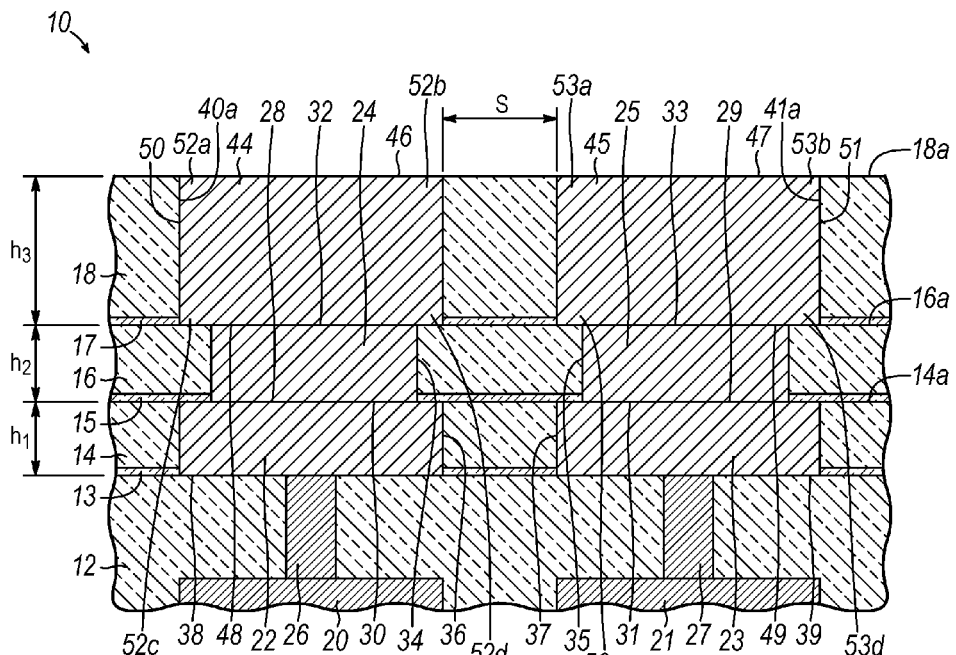

With reference to FIG. 3 in which like reference numerals refer to like features in FIG. 2 and at a subsequent fabrication stage, lines or wires 44, 45 are defined from the conductor layer 42 by a planarization process and are embedded within the dielectric layer 18. The wires 44, 45 have respective top surfaces 46, 47 that are nominally coplanar with the top surface 18a of dielectric layer 18. In a representative embodiment, chemical-mechanical polishing (CMP) may be used as a planarization process to remove excess material of conductor layer 42 from the top surface 18a of the dielectric layer 18 and to planarize the top surfaces of the wires 44, 45 relative to the top surface 18a of dielectric layer 18. Following planarization, the wires 44, 45 reside in the trenches 40, 41 as permanent remnants of the conductor layer 42 and the top surface 18a of dielectric layer 18 is free of the constituent conductor of conductor layer 42. A portion of dielectric layer 18 residing between the wires 44, 45 electrically insulates wire 44 from wire 45.

The wires 44, 45 are respectively coupled with the wires 24, 25 in the underlying metallization level and are respectively vertically aligned in a laterally overlapping relationship with the wires 24, 25. In the representative embodiment, wire 44 has a bottom surface 48 that directly contacts the top surface 32 of wire 24 and wire 45 has a bottom surface 49 that directly contacts the top surface 33 of wire 25. Wire 44 has sidewalls 50 that respectively extend vertically from the bottom surface 48 to the top surface 46 and corners 52a-d defined at the intersection of the sidewalls 50 and surfaces 46, 48. Wire 45 has sidewalls 51 that extend vertically from the bottom surface 49 to the top surface 47 and corners 53a-d defined at the intersection of the sidewalls 51 and surfaces 47, 49.

One of the sidewalls 50 of wire 44 is adjacent or proximate to one of the sidewalls 51 of wire 45 so as to represent a nearest-neighbor pair of sidewalls 50, 51 with the closest spacing, S. In one embodiment, the pair of sidewalls 50, 51 may be aligned parallel with each other. The spacing, S, separating the nearest-neighbor sidewalls 50, 51 may be less than or equal to 15 µm. Similarly, adjacent pairs of sidewalls 34, 35 of wires 24, 25 and/or adjacent pairs of sidewalls 36, 37 of wires 22, 23 may also be separated by the spacing, S.

The lateral dimensions (e.g., length and width) of the wires 44, 45 are commensurate with the lateral dimensions of the etched trenches 40, 41. The thickness or height, $h_3$, of the wires 44, 45 is likewise commensurate with the depth of the etched trenches 40, 41 and the thickness of the dielectric layer 18. The height, $h_3$, of the wires 44, 45 may be greater than or equal to 6 µm, and may range from 6 µm to 10 µm. The wires 44, 45 may be thicker than wires 22, 23 and/or thicker than wires 24, 25. The wires 22, 24, 44 and wires 23, 25, 45 in the upper metallization levels of the BEOL wiring structure 10 may be colloquially referred to as thick wire structures formed by a thick wire damascene process.

The elevated temperature anneal of the conductor layer 42 modifies the grain morphology of the constituent conductor so that stresses are reduced in the material that would otherwise form on or near the sidewalls 50 and corners 52a-d of wire 44 and the sidewalls 51 and corners 53a-d of the wire 45 during subsequent high temperature processing. Specifically, the elevated temperature anneal of the conductor layer 42 operates to increase the grain size of the constituent conductor through recrystallization. However, the form, fit, and function of the wires 44, 45 are not altered by the elevated temperature anneal of the conductor layer 42.

The preemptive elevated temperature anneal defeats the tendency of subsequent thermal processes to recrystallize the conductor of the wires 44, 45 and, consequently, reduces the probability that subsequent thermal processes can induce stresses capable of initiating cracking or facturing. In the absence of such induced stresses, the initiation of fractures or cracks at or near the edges or corners 52a-d, 53a-d of the wires 44, 45 and the ensuing propagation of the initiated fractures or cracks into the surrounding dielectric material may be reduced or eliminated in the BEOL interconnect wiring structure 10.

Figure 4:
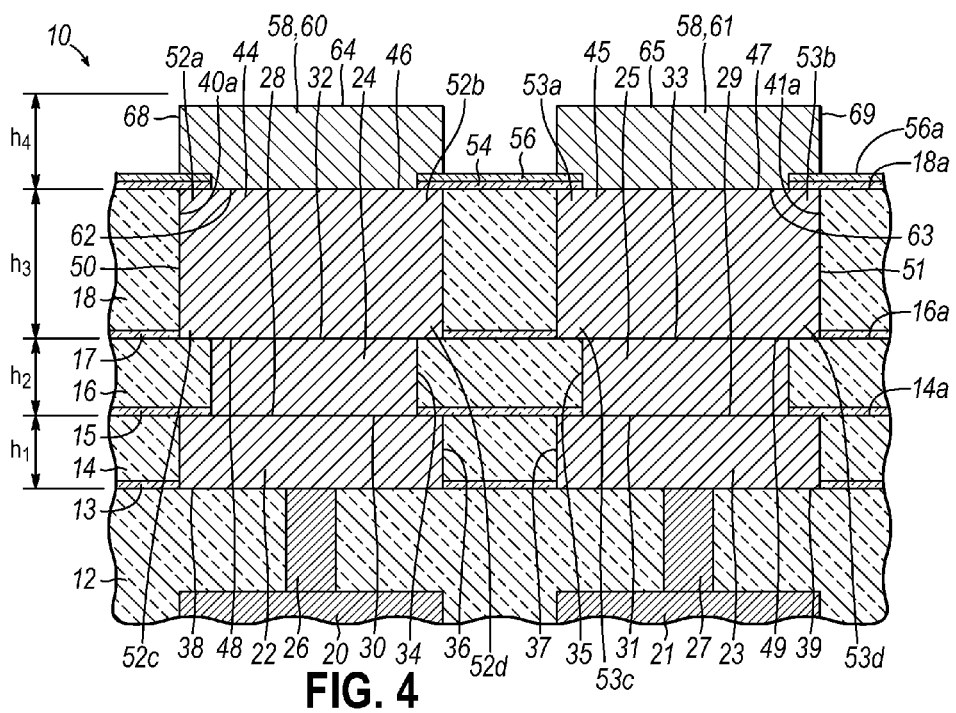
Figure 4A:
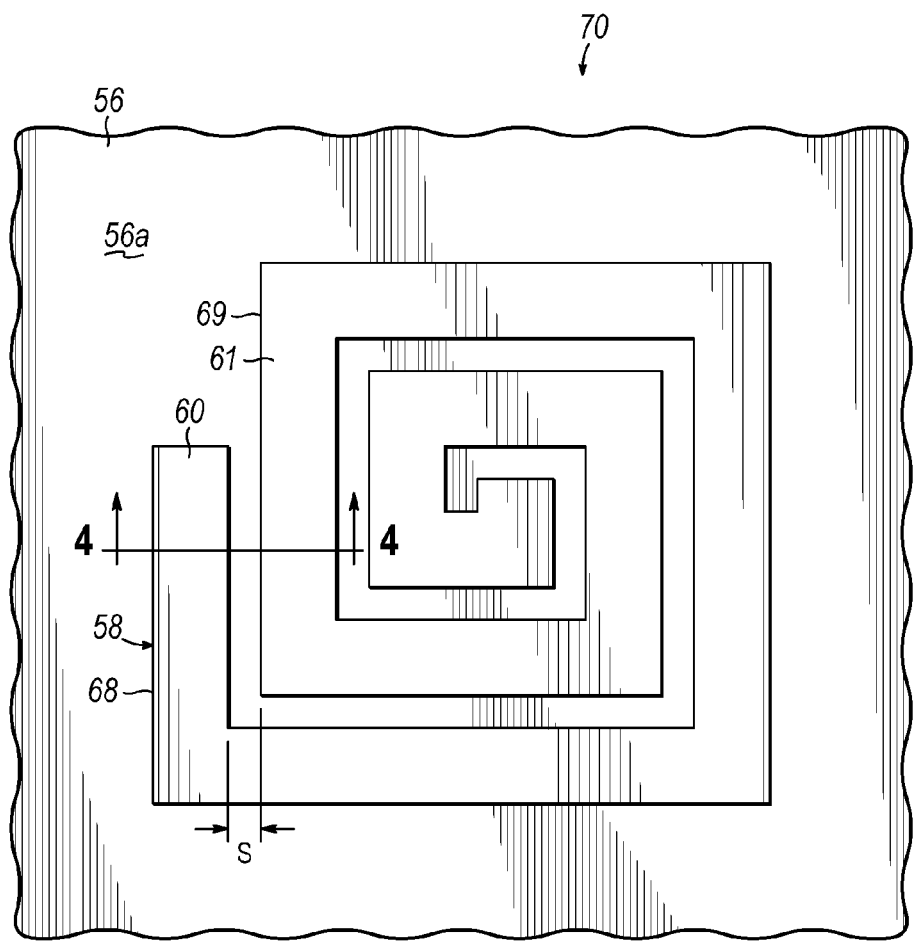
FIG. 4A is a top view that generally includes the cross-sectional view of FIG. 4 taken generally along line 4-4.

With reference to FIG. 4, 4A in which like reference numerals refer to like features in FIG. 3 and at a subsequent fabrication stage, capping layers 54, 56 are applied to the top surface 18a of dielectric layer 18. Capping layer 56, which is separated from the top surface 18a by the capping layer 54, may be comprised of a dielectric material, such as silicon dioxide ($SiO_2$), and the capping layer 54 may be comprised of $Si_3N_4$. The capping layers 54, 56 are patterned by photolithography and etch processes. The photolithography process entails applying a resist layer, exposing the resist layer to radiation imaged using a photomask, and developing the exposed resist layer. The etch process, which may be a RIE process performed with one or more etch chemistries (e.g., a fluorine-based etch chemistry), removes the material of the capping layers 54, 56 at intended locations for additional wires. In particular, openings to the wires 44, 45 are defined in the capping layers 54, 56 and preferably replicate the geometrical shape of the wires 44, 45 from a perspective normal to the top surface 18a. The resist layer is then stripped by ashing or solvent stripping.

A conductor layer 58 is deposited on the capping layer 56 as a blanket layer. In one embodiment, the conductor layer 58 may be comprised of aluminum (Al) deposited by CVD. In another embodiment, the conductor layer 58 may be comprised of Al and may further comprise small amounts of other metals, such as Cu, at an atomic concentration of 1% or less. The thickness of the conductor layer 58 may be greater than 4 µm and may range from 4 µm to 6 µm. The conductor layer 58 contacts the wires 44, 45 through the openings in the capping layers 54, 56 and may directly contact the top surfaces 46, 47 of the wires 44, 45.

Wires 60, 61 are formed from the conductor layer 58 after the conductor layer 42 is subjected to the elevated temperature anneal. The wires 60, 61 may be formed by patterning the conductor layer 58 with photolithography and subtractive etching processes. To that end, the conductor layer 58 may be covered by a patterned temporary mask layer (not shown) in the photolithography process. In one embodiment, the temporary mask layer may be a photoresist layer comprised of a sacrificial organic material applied by spin coating. The photolithography process entails exposing the photoresist layer to radiation imaged through a photomask and developing the exposed photoresist layer. A subtractive etching process, such as a RIE process (e.g., a chlorine-based RIE process if the conductor layer is comprised of aluminum), is used with an etch chemistry that removes unmasked regions of the conductor layer 58 and stops on the material of capping layer 56. At the conclusion of the subtractive etching process, the wires 60, 61 represent the residual material originating from the conductor layer 58.

The wires 60, 61 are respectively vertically aligned with the wires 44, 45 and respectively have a laterally overlapping relationship with wires 44, 45. The wires 60, 61 have bottom surfaces 62, 63 that respectively contact the top surfaces 46, 47 of the wires 44, 45. The wires 60, 61 have respective sidewalls 68, 69 that project vertically relative to the top surface 56a of capping layer 56 and that, in the representative embodiment, terminate at their bottom ends at the top surface 56a of capping layer 56. The thickness or height, $h_4$, of the wires 60, 61, which is measured from bottom surfaces 62, 63 to top surfaces 64, 65, is nominally equal to the layer thickness of the conductor layer 58. The height, $h_4$, of the wires 60, 61 may be greater than or equal to 4 µm, and may range from 4 µm to 6 µm. The sidewalls 68, 69 may represent at least 90% of the height, $h_4$, of the wires 60, 61. The composite height of wires 44, 60 and wires 45, 61 may be greater than or equal to 10 µm, and may range from 10 µm to 16 µm.

The wires 22, 24, 44, 60 are vertically arranged in a stack and the wires 23, 25, 45, 61 are likewise vertically arranged in another stack that is laterally positioned adjacent to the stack constituted by wires 22, 24, 44, 60. The stacked arrangement of wires 22, 24, 44, 60 may be identical to the stacked arrangement of wires 23, 25, 45, 61. Wire 60 may have the same nominal geometrical shape as wires 22, 24, 44, 60 and wire 61 may have the same nominal geometrical shape as wires 23, 25, 45, 61 from a perspective normal to the top surface 56a.

In one embodiment, the wires 22, 24, 44, 60 may be electrically isolated from the wires 23, 25, 45, 61. Because of the electrical isolation, wires 22, 24, 44, 60 and wires 23, 25, 45, 61 may be used, for example, as independent transmission lines to route signals to and from the active devices of the integrated circuit or may be used as transmission lines to provide power to and among the various circuit functions on the chip.

As shown in FIG. 4A and in accordance an alternative embodiment, wires 22, 24, 44, 60 and wires 23, 25, 45, 61 may be arranged to constitute adjacent windings of an inductor 70. In this instance, wires 22, 24, 44, 60 are electrically continuous with wires 23, 25, 45, 61. In the representative embodiment, the inductor 70 has a square coiled geometrical shape in which the windings have a helical arrangement. However, the windings of the inductor may have an alternative geometrical shape, such as an octagonal coil or a circular coil. The number of number of individual windings in the inductor 70, each of which comprises a stack of wires like wires 22, 24, 44, 60, may range from two (2) to ten (10).

Figure 5:
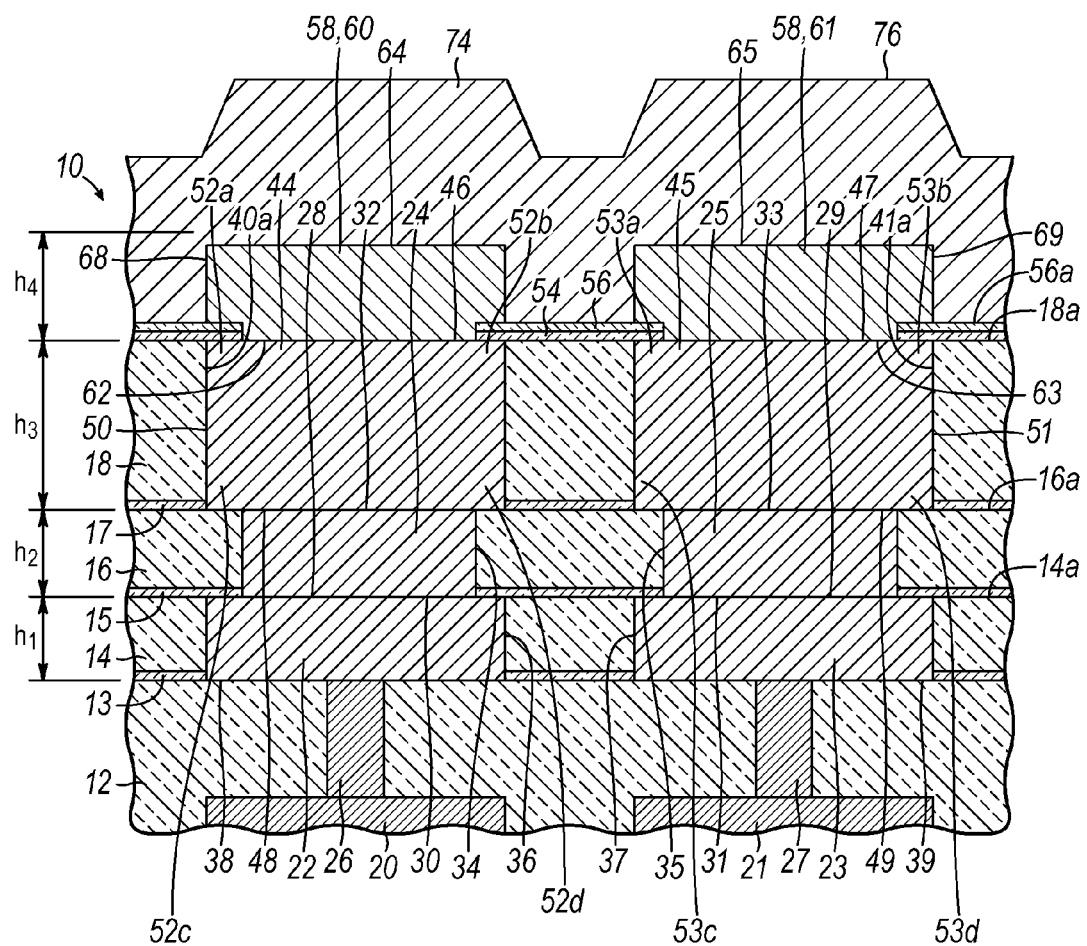

With reference to FIG. 5 in which like reference numerals refer to like features in FIG. 4 and at a subsequent fabrication stage, a final passivation layer 74 is formed on a top surface 56a of the capping layer 56 and on the wires 60, 61 of the last metal layer. The final passivation layer 74 may be comprised of an organic material, such as a polymer or an epoxy, that is an electrically insulator. In one embodiment, the final passivation layer 74 may be comprised of polyimide. In other embodiments, the final passivation layer 74 may be comprised of parylene (e.g., parylene-N) or benzo-cyclobutene (BCB). The final passivation layer 74 has a dielectric constant of at least 2.0, which that is significantly higher than the dielectric constant (1.0) of air in an air gap.

The final passivation layer 74 may be formed by depositing a precursor coating with spin coating, followed by a low temperature pre-bake. Contact openings may be formed as windows in the pre-baked precursor coating at the locations of bond pads. If the precursor coating is comprised of a photosensitive organic material (e.g., photosensitive polyimide), the precursor coating can be directly patterned and etched to form the contact openings. The final passivation layer 74 is free of inorganic materials, such as silicon dioxide or silicon nitride. The precursor coating may be baked to provide the final passivation layer 74. A top surface 76 of the final passivation layer 74 represents a topmost surface of the BEOL interconnect structure 10 and no additional dielectric layers of inorganic materials are added onto the top surface 76.

The final passivation layer 74, which is exclusively comprised of organic material, covers an entirety of the respective sidewalls 68, 69 of the wires 60, 61. In one embodiment, the final passivation layer 74 covers the entirety of the sidewalls 68, 69. This contrasts with conventional final passivation structures in which the sidewalls 68, 69 and top surface of the wires 60, 61 are covered by one or more conformal layers of inorganic dielectric material(s), such as silicon dioxide or silicon nitride. The entirety of the sidewalls 68, 69 of the wires 60, 61, as well as the top surfaces of the wires 60, 61, are free of such inorganic materials. If capping layers 54, 56 are absent, the sidewalls 68, 69 extend over the entire height, $h_4$, of the wires 60, 61 and the final passivation layer 74 may cover the entire height, $h_4$, of the wires 60, 61.

The mechanical properties of the organic material comprising the final passivation layer 74 differ from the mechanical properties of typical inorganic dielectric materials, such as silicon dioxide or silicon nitride, used in passivation layers. In particular, the organic material comprising the final passivation layer 74 may exhibit a lower elastic modulus and a higher Poisson's ratio than inorganic dielectric materials so that the final passivation layer 74 is comparatively softer and less rigid. As examples, silicon dioxide is characterized by an elastic modulus of 66-73 GPa and a Poisson's ratio of 0.17, silicon nitride is characterized by an elastic modulus of 200 to 310 GPa and a Poisson's Ratio of 0.27, and polyimide is characterized by an elastic modulus of 2.5 to 3.2 GPa and a Poisson's Ratio of 0.35. For these exemplary materials, the elastic modulus of polyimide is an order of magnitude smaller than the elastic modulus of either silicon dioxide or silicon nitride, and the Poisson's Ratio of polyimide is at least 30% larger than the Poisson's Ratio of either silicon dioxide or silicon nitride.

Eliminating inorganic dielectric materials from the final passivation layer 74 also eliminates the constraining material surrounding the final metal level (wires 60, 61). Thermal expansion and contraction of the wires 60, 61 of the last metal level, which slightly changes the dimensions of the wires 60, 61, can occur without fracturing the surrounding dielectric material(s) in dielectric layer 18 and capping layers 54, 56. Specifically, the reduction in hardness and rigidity in the final passivation layer 74 provides flexibility that reduces or eliminates the initiation of cracks or fractures at or near the corners or edges of the wires 60, 61 during thermal cycling. The reduction or elimination of such cracking or fracturing contrasts with final passivation structures that incorporate inorganic dielectric layers, which have a comparatively high elastic modulus. If crack or fracture initiation is reduced or absent, then such cracks or fractures cannot propagate, following initiation, into the surrounding dielectric material in dielectric layer 18 and capping layers 54, 56 will be reduced in or absent from the fabricated BEOL interconnect wiring structure 10. The elimination of inorganic dielectric materials from the final passivation layer 74 also eliminates hot thermal process steps associated with the deposition of the inorganic dielectric materials.

The final passivation layer 74 functions to protect the chip from mechanical abrasion during probe and packaging, and also functions to provide a barrier to environmental contaminants.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. The chip may be integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. Other types of end products may include cellular telephones and wireless devices.

Figure 6:
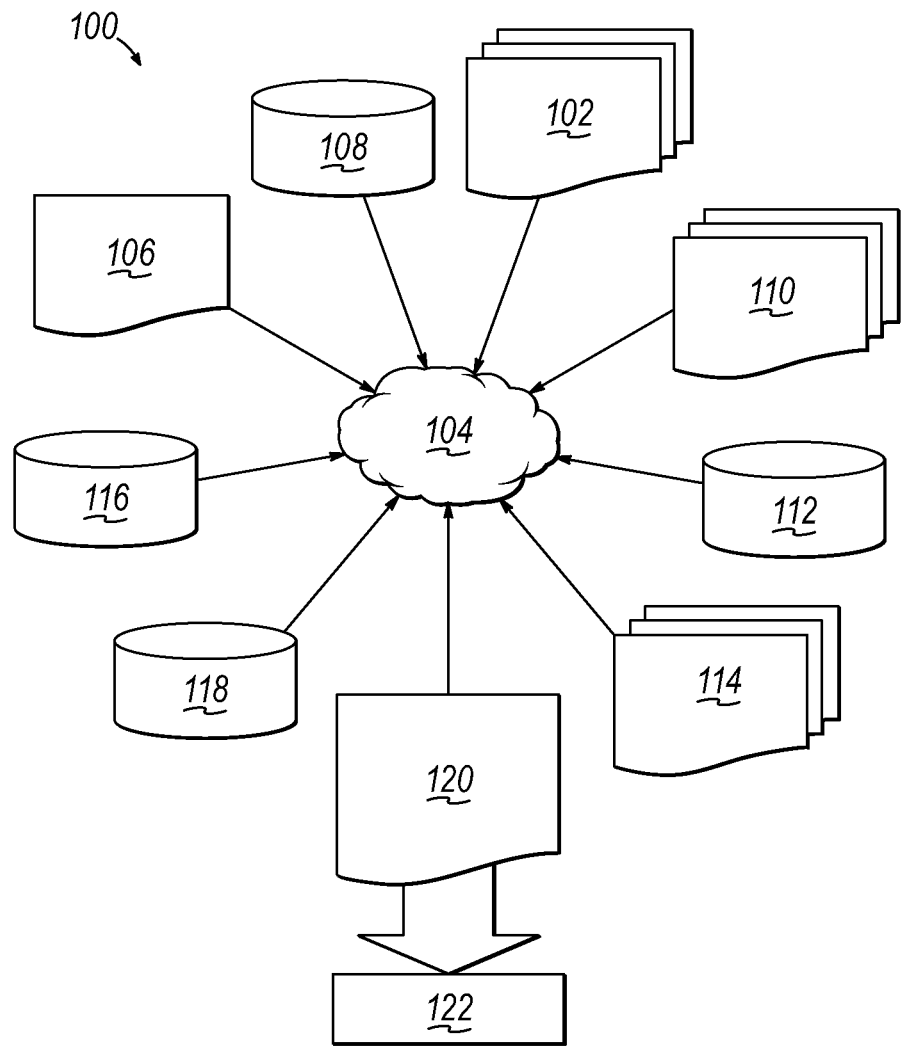
FIG. 6 is a flow diagram of a design process used in semiconductor design, manufacture, and/or test.

FIG. 6 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIG. 5. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 6 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIG. 5. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIG. 5 to generate a netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 84 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 5. In one embodiment, design structure 120 may comprise a compiled, executable HDL simulation model that functionally simulates the devices shown in FIG. 5.

Design structure 120 may also employ a data format used for the exchange of layout data of integrated circuits and/or symbolic data format (e.g., information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 5. Design structure 120 may then proceed to a stage 122 where, for example, design structure 120: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The term "vertical" refers to a direction perpendicular to the horizontal, as just defined. The term "lateral" refers to a dimension within the horizontal plane.

It will be understood that when an element is described as being "connected" or "coupled" to or with another element, it can be directly connected or coupled with the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a back-end-of-line wiring structure, the method comprising:
    forming a first wire and a second wire in a first dielectric layer;
    annealing the first wire and the second wire in an oxygen-free atmosphere;
    after annealing the first wire and the second wire, forming a third wire that is stacked with the first wire and a fourth wire that is stacked with the second wire; and
    forming a final passivation layer comprised of an organic material that covers an entirety of a sidewall of the third wire and of a sidewall of the fourth wire,
    wherein the first wire and the second wire each have a thickness ranging from 6 microns to 10 microns, the third wire and the fourth wire each have a thickness ranging from 4 microns to 6 microns, and the second wire is adjacent to the first wire and laterally separated from the first wire by a distance less than or equal to 15 microns.

2. The method of claim 1 wherein forming the first wire and the second wire in the first dielectric layer comprises:
    depositing the first dielectric layer;
    etching a trench in the first dielectric layer; and
    depositing a conductor layer that partially resides in the trench to define the first and second wires and that covers a top surface of the first dielectric layer.

3. The method of claim 2 further comprising:
    after annealing, removing the conductor layer from the top surface of the first dielectric layer so that the top surface of the first and second wires is planarized relative to the top surface of the first dielectric layer.

4. The method of claim 3 wherein the conductor layer is removed from the top surface of the first dielectric layer by chemical-mechanical polishing.

5. The method of claim 1 wherein the oxygen-free atmosphere comprises nitrogen gas.

6. The method of claim 1 wherein the first wire and the second wire are annealed at a temperature in a range of 250° C. to 425° C.

7. The method of claim 1 wherein the third wire is formed in direct contact with the first wire, the fourth wire is formed in direct contact with the second wire, the first wire and the second wire are formed by a damascene process, and the third wire and the fourth wire are formed by subtractive etching.

8. The method of claim 1 wherein forming the third wire that is stacked with the first wire and the fourth wire that is stacked with the second wire comprises:
   depositing a blanket conductor layer on a top surface of the first dielectric layer, the first wire, and the second wire; and
   subtractively etching the conductor layer to define the third wire and the fourth wire.

9. The method of claim 8 wherein the conductor layer is deposited and subtractively etched before the final passivation layer is formed.

10. The method of claim 1 wherein the first and second wires are comprised of a first conductor, and the third and fourth wires are comprised of a second conductor different from the first conductor.

11. The method of claim 1 further comprising:
   forming a capping layer on the first dielectric layer,
   wherein a portion of the third wire extends through the capping layer to the first wire, and the sidewall of the third wire terminates at a top surface of the capping layer.

12. The method of claim 1 wherein the first wire is comprised of copper, and the third wire is comprised of aluminum.

13. The method of claim 1 wherein the third wire and the fourth wire are comprised of aluminum and less than or equal to 1 percent of copper.

14. The method of claim 13 wherein the first and third wires define a first winding of an inductor, and the second and fourth wires define a second winding of the inductor.

15. The method of claim 1 wherein annealing the first wire and the second wire in the oxygen-free atmosphere comprises:
   increasing a grain size of a conductor comprising the first wire and the second wire through recrystallization.

16. The method of claim 1 wherein the first and third wires comprise a first winding of an inductor, and the second and fourth wires comprise a second winding of the inductor.

* * * * *